Feb. 27, 1962 L. W. ERATH 3,023,368
DIRECT COUPLED TRANSISTOR AMPLIFIER
Filed July 15, 1958
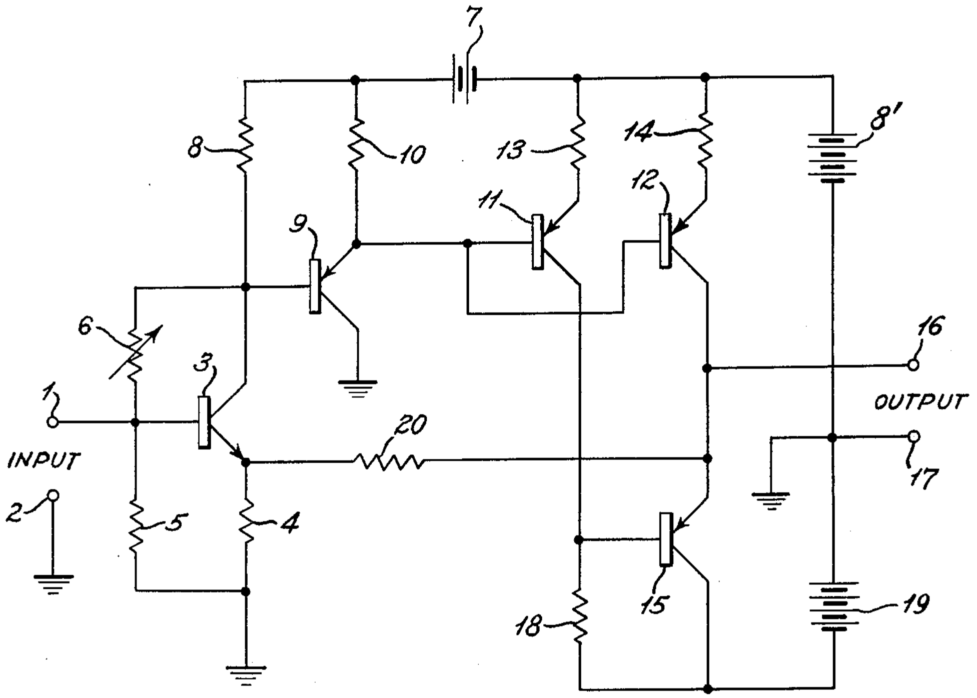
INVENTOR
Louis W. Erath
BY
Burns, Doane, Benedict & Irons
ATTORNEYS United States Patent Office 3,023,368

Patented Feb. 27, 1962

3,023,368

DIRECT COUPLED TRANSISTOR AMPLIFIER

Louis W. Erath, Houston, Tex., assignor to Southwestern Industrial Electronics Co., Houston, Tex., a corporation of Delaware Filed July 15, 1958, Ser. No. 748,637
3 Claims. (Cl. 330—14)

This invention relates to a transistor amplifier, and more particularly, to a very stable output and stable gain transistor amplifier circuit.

Transistor amplifiers are notoriously unstable and rather complex circuits have been designed to increase their stability. It is especially difficult to maintain the gain characteristics and the output of a directly connected transistor amplifier stable. The present invention has for its main object the design of a transistor amplifier circuit which is of stable characteristics, no matter how different the characteristics of the different transistors employed may be.

The invention, generally speaking, employs a pair of common emitter-connected transistors with their bases D.-C. coupled to receive an input signal and with their emitters connected to a bias source through resistors. The collector of one transistor is connected to the collector of the other through an emitter follower transistor stage. If the two common emitter transistors have identical gain characteristics, their emitter resistors are selected to be identical, but if their gain characteristics are not the same, the resistor values are chosen to compensate for any differences. The circuit also employs a driver transistor which is connected to the output through a feedback resistor in order to further stabilize the characteristics of the amplifier.

The invention will now be more fully described in conjunction with a preferred embodiment thereof shown in the accompanying drawing.

The single FIGURE of the drawing is a schematic diagram of the preferred embodiment of the invention.

Referring to the drawing, the input signal is applied to terminal 1 and grounded terminal 2, and is supplied to the base-emitter circuit of an NPN transistor 3 by direct connection between terminal 1 and the base of the transistor. The emitter of the transistor is connected to ground through emitter resistor 4, while the base is supplied with bias voltage through a voltage divider comprising resistors 5 and 6 connected between the collector and ground and having their junction connected to the transistor base. Resistor 6 is variable in order to permit adjustment of the bias of the base transistor 3.

The collector of transistor 3 is connected to the positive side of a bias source 7 through collector resistor 8. The negative side of the source is connected to the positive side of a second source 8′, while the negative side of this source is connected to ground. The collector of transistor 3 is also connected to the base of a PNP transistor 9 which is connected as an emitter follower, its collector being grounded. The emitter of transistor 9 is connected to the positive side of bias source 7 through emitter resistor 10.

Signal voltage amplified by transistor 3 and coupled through emitter follower transistor 9 is supplied to the bases of PNP transistors 11 and 12, their bases being directly connected to the emitter of transistor 9. The emitters of transistors 11 and 12 are respectively connected to the positive side of source 8′ through resistors 13 and 14. The collector of transistor 12 is connected to one of the output terminals, while the other output terminal is grounded. The collector of transistor 11 is directly connected to the base of another PNP transistor 15 which has its emitter connected to output terminal 16. The grounded output terminal is labeled 17.

The base of transistor 15 is connected to its collector through a resistor 18 and connected to the negative side of a third bias voltage source 19, the positive side of this source being grounded.

Feedback is provided for further stabilization of the amplifier by connection of the junction between the collector of transistor 12 and the emitter of transistor 15 to the emitter of transistor 3 through feedback resistor 20.

Transistors 11 and 12 have similar gain characteristics, and if their gain characteristics are identical, then resistors 13 and 14 are of identical value. Since the voltage drop between the base and emitter of transistor 15 is negligible, being around one-tenth of a volt, the voltage at the collector of transistor 11 is almost the same as the voltage at the collector of transistor 12. Assuming the gain characteristics of transistors 11 and 12 are identical, then their emitter resistors are identical, and since the collector voltages are substantially identical, the currents through transistors 11 and 12 must be equal. Any slight differences between the transistors will be minimized by the degenerative effect of resistors 13 and 14.

Current at the output terminals is controlled by the magnitude of resistor 18. If its value is reduced, the voltage at the base of transistor 15 will tend to become more negative with respect to the collector thereof. As this point becomes more negative, the voltage across resistor 20 also becomes more negative, since this resistor is in the feedback path to the emitter of transistor 3. If the emitter of transistor 3 becomes more negative, signal to the base of transistor 9 will also become more negative. Since transistor 9 is an emitter follower, the collector of transistor 11 will tend to become more positive, transistor 11 being connected as a stage of gain. The current will therefore increase in transistor 11, but this causes the voltage between its base and emitter to increase. The emitter becomes more negative, and, since the emitter of transistor 11 is connected to the supply through resistor 13 and the emitter of transistor 12 is connected to the supply through resistor 14, both emitters will experience the same increase in current, thereby increasing the current through resistor 18 by the same amount. This increase in current compensates for change in the value of resistor 18.

Since transistors 11 and 12 must maintain the fixed relationship above described with respect to current and voltage, any type of transistor can be used for transistors 11 and 12. The ratio of resistors 13 and 14 will determine the current gain through resistor 18, since the larger resistor 13 becomes, with respect to resistor 14, the greater the current gain through transistor 12.

It will be evident that a highly stable amplifier which has extremely small distortion has been described. It will be also evident that many minor changes could be made in the apparatus described without departure from the scope of the invention. Further, though transistors 9, 11, 12 and 15 must be of the same conductivity type, they may be of NPN type, rather than PNP. It is also evident that for the particular connection shown, transistor 3 must be of the opposite polarity from the other transistors.

Since many minor changes can be made in the apparatus without departure from the scope of the invention, the invention is not to be considered limited to the specific embodiment shown, but rather only by the scope of the appended claims.

I claim:

1. A transistor amplifier comprising at least four transistors, a voltage source including a pair of voltage supplies having their respective positive and negative terminals connected together to form a point of reference potential and to make available a pair of other terminals, means for connecting the input signal between base and emitter of the first transistor including a first resistor connected between the emitter of said first transistor and the reference point, means connecting the collector of said first transistor to one of said pair of terminals, means connecting the collector of said first transistor in parallel to the bases of the second and third transistors, said last-named means including a direct conductive connection between said bases, second and third resistors connected respectively between said one of said pair of terminals and the emitters of said second and third transistors; conductive connections between the collector of said second transistor and the base of the fourth transistor, between the collector of said fourth transistor and the other of said pair of terminals, between the emitter of said fourth transistor and the collector of said third transistor, and between the emitter of said first transistor and the junction between the collector of said third transistor and the emitter of said fourth transistor; a fourth resistor connected between the base and collector of said fourth transistor, the output of the amplifier being available between said junction and said reference point, said second, third and fourth transistors being all of the same conductivity type.

2. The apparatus of claim 1 in which said third-named connecting means includes a fifth transistor having its base connected directly to the collector of said first transistor, its collector connected to said reference point, and its emitter conductively connected to the bases of said second and third transistors, said fifth transistor being of the same conductivity type and said first transistor being of the opposite conductivity type from said second, third and fourth transistors.

3. The apparatus of claim 2 in which said last-named conductive connection includes a feedback resistor connected between the emitters of said first and fourth transistors.

References Cited in the file of this patent

UNITED STATES PATENTS

| | | |
|---|---|---|
| 2,659,775 | Coulter | Nov. 17, 1953 |
| 2,691,075 | Schwartz | Oct. 5, 1954 |
| 2,700,704 | Minter | Jan. 25, 1955 |
| 2,762,874 | Barco | Sept. 11, 1956 |
| 2,777,020 | Dobosy | Jan. 8, 1957 |
| 2,789,164 | Stanley | Apr. 16, 1957 |
| 2,942,199 | Lee | June 21, 1960 |

OTHER REFERENCES

Herscher: "Designing Transistor A-F Power Amplifiers," Electronics Engineering Edition, April 11, 1958.